(12) United States Patent
Buzzetti et al.

(10) Patent No.: US 12,665,591 B2
(45) Date of Patent: Jun. 23, 2026

(54) DRIVER CIRCUIT AND METHOD FOR SUPPLYING LIMITED CURRENT TO A LOAD

(71) Applicant: Maxim Integrated Products, Inc., San Jose, CA (US)

(72) Inventors: Siro Buzzetti, Limerick (IE); Marco Demicheli, Limerick (IE); Danilo Ranieri, Limerick (IE); Roberto Casiraghi, Limerick (IE)

(73) Assignee: Maxim Integrated Products, Inc., San Jose, CA (US)

( * ) Notice: Subject to any disclaimer, the term of this patent is extended or adjusted under 35 U.S.C. 154(b) by 25 days.

(21) Appl. No.: 18/644,061

(22) Filed: Apr. 23, 2024

(65) Prior Publication Data

US 2025/0330174 A1    Oct. 23, 2025

(51) Int. Cl.
| | |
|---|---|
| *H03K 17/30* | (2006.01) |
| *H03K 3/0233* | (2006.01) |
| *H03K 17/0812* | (2006.01) |
| *H03K 17/08* | (2006.01) |

(52) U.S. Cl.
CPC ......... *H03K 17/302* (2013.01); *H03K 3/0233* (2013.01); *H03K 17/08122* (2013.01); *H03K 2017/0806* (2013.01)

(58) Field of Classification Search
CPC ............... H03K 17/302; H03K 3/0233; H03K 17/08122; H03K 2017/0806; H03K 17/30; H03K 3/02332; H03K 17/0812; H03K 17/0814; H03K 17/08142; H03K 17/082; H03K 17/0822; H03K 17/14; H03K 17/145
See application file for complete search history.

(56) References Cited

U.S. PATENT DOCUMENTS

2014/0210445 A1* 7/2014 Hasegawa ........... H02M 3/1588
323/284

* cited by examiner

*Primary Examiner* — Jung Kim
(74) *Attorney, Agent, or Firm* — DLA Piper LLP (US)

(57) ABSTRACT

A driver circuit includes a primary driver sub-circuit, a comparator sub-circuit and an auxiliary driver sub-circuit. The primary driver sub-circuit is configured to (i) generate an output voltage, and (ii) supply a predetermined maximum amount of current from a power source to a load via a first switch. The comparator sub-circuit is configured to (i) detect when a high-power dissipation condition exists which could lead to overheating the primary driver sub-circuit, and (ii) based on detection of the condition, generate a first output signal. The auxiliary driver sub-circuit is configured to, based on the first output signal, transition between (i) pulling-up the output voltage to the source voltage and supplying current from the power source to the load, and (ii) decreasing an amount of current being supplied to the load.

10 Claims, 7 Drawing Sheets

Time (ms)

<u>FIG. 6</u>

DRIVER CIRCUIT AND METHOD FOR SUPPLYING LIMITED CURRENT TO A LOAD

FIELD

The present disclosure relates to circuits for supplying power to a load. More particularly, the present disclosure relates to switch, pass-gate, and/or driver sub-circuits that supply a predefined amount of current to a load.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Electronic devices (e.g., network devices, mobile devices, appliances, etc.) include one or more drivers for supplying a predetermined amount of current to a load. A driver sources an amount of current $I_{LOAD}$ from a supply node IN to a load. The current $I_{LOAD}$ may be limited to a predefined level of current $I_{LIMITED}$. The supply node may be at a source voltage, which is provided by a power source (e.g., a battery or utility power) via a power supply input line. The load is connected to an output of the driver. The driver dissipates an amount of power P, which is equal to the current $I_{LOAD}$ multiplied by a voltage difference between (i) the source voltage (or input voltage $V_{IN}$ of the driver) and (ii) an output voltage $V_{OUT}$ of the driver. The current $I_{LOAD}$ provided by the driver may be limited to $I_{LIMITED}$ in order not to over-load the power supply input line and/or corresponding power source.

When the power P is equal to $I_{LIMITED}*(V_{IN}-V_{OUT})$ and $I_{LOAD}=I_{LIMITED}$, a temperature of the driver increases. If the temperature increases to a safety level (e.g., 150° Celsius (C)), the driver is turned-off in order to prevent damage to the driver and/or a corresponding electronic device in which the driver is located. For example, if $V_{IN}$ is 24 volts (V) and $I_{LIMITED}$ is 1 ampere (A), the power P dissipated during a current limiting condition can reach 24 watts (W). Since packages for power integrated circuits can have a junction to ambient thermal resistance $\theta_{ja}$ of more than 10° C./W, a current-limit condition can cause the driver (referred to sometimes as a power integrated circuit) to transition into a thermal shutdown if the current-limit condition persists for more than a predetermined period. The junction to ambient thermal resistance $\theta_{ja}$ is a result of dividing a difference between an ambient temperature and a junction temperature by power dissipated. The amount of time to transition to thermal shutdown depends on a thermal capacitance of the power integrated circuit. The predetermined period can be, for example, 10-100 milliseconds (ms). If a power integrated circuit transitions to thermal shutdown, the power integrated circuit temporarily stops providing current to a load.

SUMMARY

A driver circuit is provided and includes a primary driver sub-circuit, a comparator sub-circuit and an auxiliary driver sub-circuit. The primary driver sub-circuit is configured to (i) generate an output voltage, and (ii) supply a predetermined maximum amount of current from a power source to a load via a first switch. The first switch is connected between the power source and the load. The power source supplies a source voltage. The comparator sub-circuit is configured to (i) detect when a high-power dissipation condition exists which could lead to overheating the primary driver sub-circuit, and (ii) based on detection of the condition, generate a first output signal. In one embodiment, a comparator module senses $V_{IN}-V_{OUT}$ and therefore its output signal tells whether $V_{OUT}$ is lower than $V_{IN}$ by some amount. This condition indicates that the first switch dissipates high-power when current flows through it. One skilled in the art will recognize that various other methods may be used to detect when a high-power dissipation condition exists within a circuit including a comparison of a current-sense signal to a threshold value (e.g., a predetermined $I_{LIMIT}$).

The primary driver sub-circuit is configured to control a state of the first switch based on the first output signal. The auxiliary driver sub-circuit is configured to, based on the first output signal, transition between (i) pulling-up the output voltage to the source voltage and supplying current from the power source to the load, and (ii) decreasing an amount of current being supplied to the load.

In other features, a method is provided and includes: via a primary driver sub-circuit, (i) generating an output voltage, and (ii) supplying a predetermined maximum amount of current from a power source to a load via a first switch in the primary driver sub-circuit, where the first switch is connected between the power source and the load, and where the power source supplies a source voltage; and detecting when a condition exists for the predetermined maximum amount of current to be supplied to the load. The method further includes: based on detection of the condition, generating a first output signal, wherein the primary driver sub-circuit is configured to control a state of the first switch based on the first output signal; controlling, via the primary driver sub-circuit, a state of the first switch based on the first output signal; and based on the first output signal, transitioning, via an auxiliary driver sub-circuit, between (i) pulling-up the output voltage to the source voltage and supplying current from the power source to the load, and (ii) decreasing an amount of current being supplied to the load.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

Figure 1:
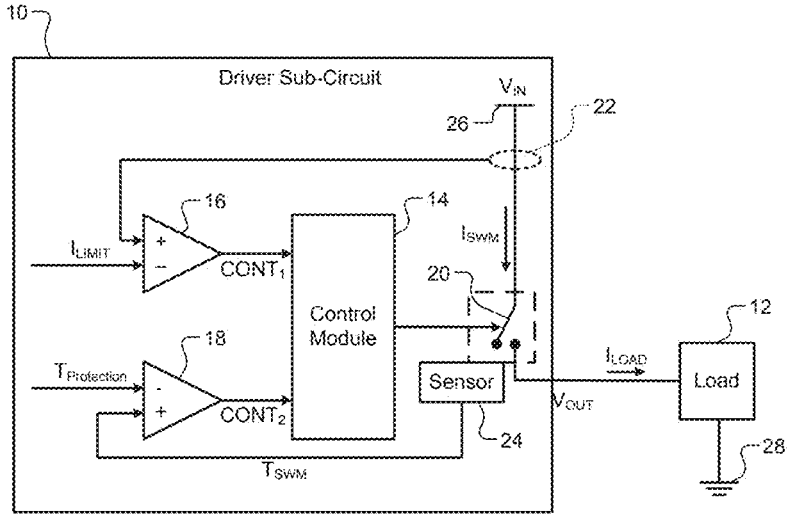
FIG. 1 is a block and schematic diagram of a driver sub-circuit with current limit capability and thermal protection.

FIG. 1 shows a traditional driver sub-circuit 10 with current limit capability and thermal protection. The driver sub-circuit 10 provides current $I_{LOAD}$ to a load 12. The driver sub-circuit 10 includes a control module 14, a first operational amplifier 16, a second operational amplifier 18, a switch 20, a current sensor 22 and a temperature sensor 24. The control module 14 controls operation of the switch 20 based on outputs of the first operational amplifier 16 and the second operational amplifier 18. The switch 20 is used to supply power from a power supply input line 26 to the load 12. Current $I_{SWM}$ is supplied from the power supply input line 26 via the switch 20 to the load 12 when the switch 20 is in a closed state. When the switch 20 is in a closed state the current $I_{LOAD}$ is increased to $I_{SWM}$. The load 12 may be a large capacitance connected to a fixed potential (e.g. a ground reference 28) or may be a capacitance connected in parallel to other electronic components. The capacitances may be included for implementations when a driver sub-circuit (e.g., the driver sub-circuit 10) is used to connect/disconnect an electrical system (or sub-system) to a power supply. The power supply may provide power to the power supply input line 26.

The first operational amplifier 16 compares the current $I_{SWM}$ detected by the current sensor 22 to the current $I_{LIMIT}$ and generates a current limit (or first control) signal. If $I_{SWM} > I_{LIMIT}$, then the control module 14 modulates resistance of the switch 20 and/or transitions the switch 20 between open and closed states to regulate the current $I_{SWM}$ to $I_{LIMIT}$. The second operational amplifier 18 compares a temperature threshold $T_{PROTECTION}$ to a temperature $T_{SWM}$ of the switch 20 as detected by the temperature sensor 24. The second operational amplifier 18 generates a thermal shutdown (or second control signal) based on the comparison between $T_{PROTECTION}$ and $T_{SWM}$. If $T_{SWM} > T_{PROTECTION}$, then the control module 14 transitions the switch 20 to an open state and the current $I_{SWM}$ decreases to 0. The switch 20 is turned back ON when $T_{SWM}$ decreases below $T_{PROTECTION} - T_{HYST}$, where $T_{HYST}$ is a hysteresis temperature. If $I_{SWM} \leq I_{LIMIT}$ and $T_{SWM} \leq T_{PROTECTION}$, then the switch 20 is in the closed state.

If a power integrated circuit (e.g., the driver sub-circuit 10) transitions to thermal shutdown, the power integrated circuit temporarily stops providing current to a load. This slows down a turn-on phase of the load and can sometimes cause malfunctioning of the load. The malfunctioning can occur if the load is an electrical system that starts sinking current when power supplied by the corresponding driver sub-circuit exceeds a certain level. The load may be a large capacitance connected to a fixed potential (e.g. a ground reference) or may be a capacitance connected in parallel to other electronic components. The capacitances may be included for implementations when the driver sub-circuit is used to connect/disconnect an electrical system (or sub-system) to and from a power supply.

For applications when a driver sub-circuit (e.g., the driver sub-circuit 10) includes a switch, which provides power to a load (capacitance in parallel with an electrical sub-system), thermal shut down can prevent the capacitance of the load from being charged up to a power supply input voltage $V_{IN}$ (e.g., 24V). When the switch is turned ON, the driver sub-circuit starts charging the capacitance with the limited current $I_{LIMITED}$. During this process, heat generated inside the driver sub-circuit causes the driver sub-circuit to cycle into and out of thermal shutdown, which reduces an average output current $I_{OUT\_AVE}$ of the driver sub-circuit to be less than $I_{LIMITED}$. The average output current $I_{OUT\_AVE}$ depends on the power dissipation and the thermal characteristics of the package of the driver sub-circuit. The capacitance may eventually charge up to an under-voltage lockout threshold (e.g., 10V) at which point the load then turns-ON and starts sinking the load current $I_{LOAD}$. If $I_{LOAD} > I_{OUT\_AVE}$, the capacitance never charges up to $V_{IN}$ and the voltage across the capacitance and thus provided to the electrical sub-system of the load never reaches an appropriate steady state condition.

Figure 2:
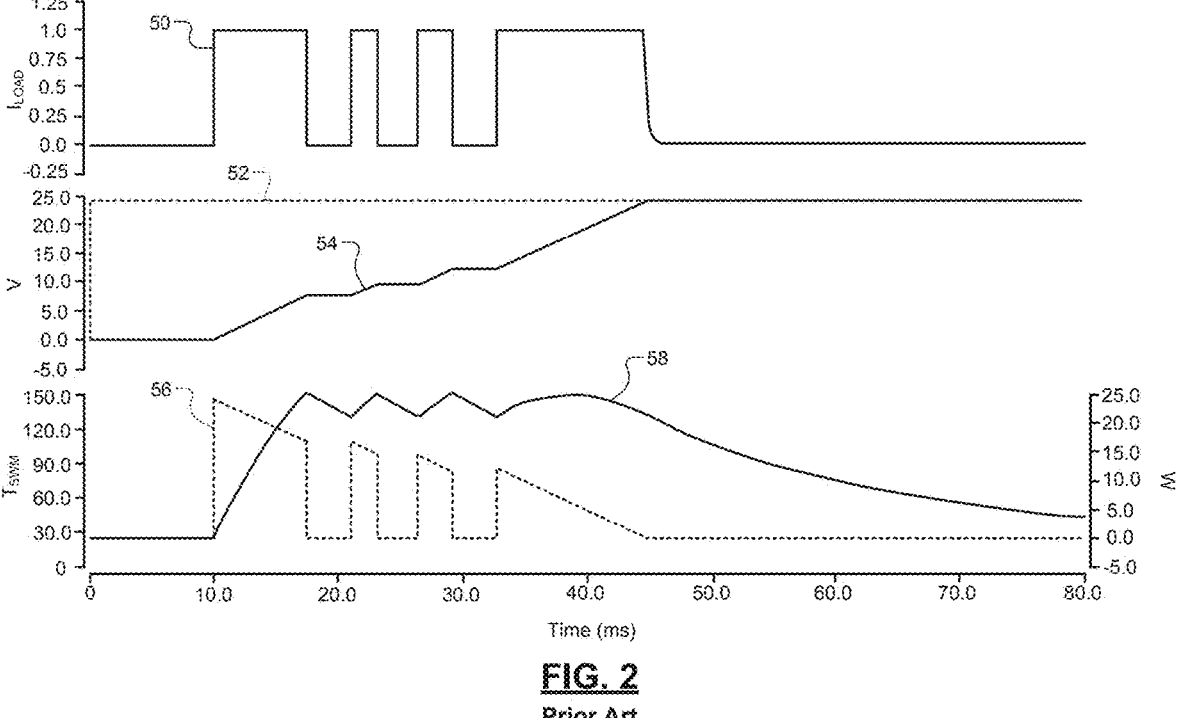
FIG. 2 is a signal diagram for the driver sub-circuit of FIG. 1 and a large capacitance load.

FIG. 2 shows a signal diagram for the driver sub-circuit 10 of FIG. 1 illustrating a load current $I_{LOAD}$ (signal line 50), input and output voltages $V_{IN}$, $V_{OUT}$ (signal lines 52, 54), a switch power $P_{SWM}$ (signal line 56) and a switch temperature $T_{SWM}$ (signal line 58). The plots of $I_{LOAD}$, $V_{IN}$, $V_{OUT}$, $P_{SWM}$ and $T_{SWM}$ illustrate when the $I_{SWM} > I_{LIMITED}$ and when $T_{SWM} > T_{PROTECTION}$. The condition of $T_{SWM} > T_{PROTECTION}$ is illustrated by the instances when $I_{LOAD}$ decreases to zero, $P_{SWM}$ is turned OFF, and $T_{SWM}$ decreases from the threshold of 150° C. The condition of $I_{SWM} > I_{LIMITED}$ and modulation of a resistance of the switch 20 is shown by $I_{LOAD}$. The amplifier 16 and the control module 14 operate to prevent $I_{SWM}$ from exceeding $I_{LIMITED}$. In the example shown $I_{LIMITED}$ is 1 A.

For the example of FIG. 2, the load 12 includes only a capacitance large enough to cause the driver sub-circuit 10 to reach thermal shutdown. As a consequence, time to charge the capacitance to a steady-state voltage is longer as compared to a situation in which thermal shutdown is never reached.

Figure 3:
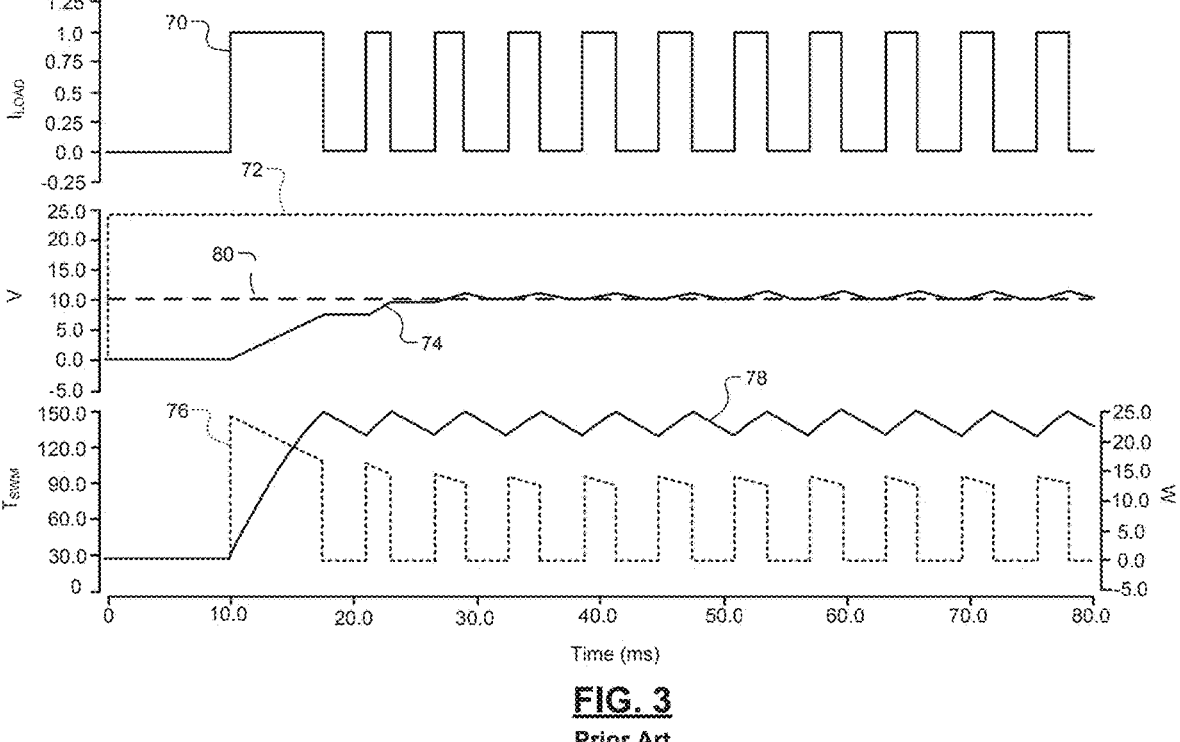
FIG. 3 is a signal diagram for the driver sub-circuit of FIG. 1 and a load that includes a capacitance and additional circuit components.

FIG. 3 shows a signal diagram for the driver sub-circuit 10 of FIG. 1 illustrating a load current $I_{LOAD}$ (signal line 70), input and output voltages $V_{IN}$, $V_{OUT}$ (signal lines 72, 74), a switch power $P_{SWM}$ (signal line 76) and a switch temperature $T_{SWM}$ (signal line 78). For the example of FIG. 3, the load 12 includes a capacitance and an electrical sub-system. The load 12 starts sinking a current $I_{LIMIT}/2$ when $V_{OUT}$ of the driver sub-circuit 10 reaches the under-voltage lockout threshold (e.g., 10V, which is shown by line 80). With the parameters of FIG. 3, it can be seen that $V_{OUT}$ never reaches the steady-state voltage (or final level) and as a result, the electrical sub-system does not operate appropriately. For example purposes only, the parameters of the example of FIG. 3 include $V_{IN} = 24V$, $I_{LIMITED} = 1$ A, a load capacitance $C_{LOAD} = 1$ milli-Farad (mF), a switch junction to ambient thermal resistance=20° C./W, and a switch thermal capacitance=1 milli-Joules per degree Celsius (mJ/C).

The below disclosed examples solve the above-stated problems by reducing power dissipated during current-limiting conditions. Heat generated inside a driver sub-circuit and corresponding driver circuit is low and as a result thermal shutdown is prevented and/or does not occur. Driver circuits are disclosed that provide current to respective loads without interruptions due to overheating. The disclosed driver circuits each include primary and auxiliary driver sub-circuits. Each of the auxiliary driver sub-circuits has intrinsically a high operating efficiency when providing a limited amount of current to a load. Each driver circuit includes devices to determine which of the primary and auxiliary driver sub-circuits to be activated at any moment in time. This determination is based on a demanded load current, which aids in maximizing power efficiency of the corresponding driver circuit.

Figure 4:
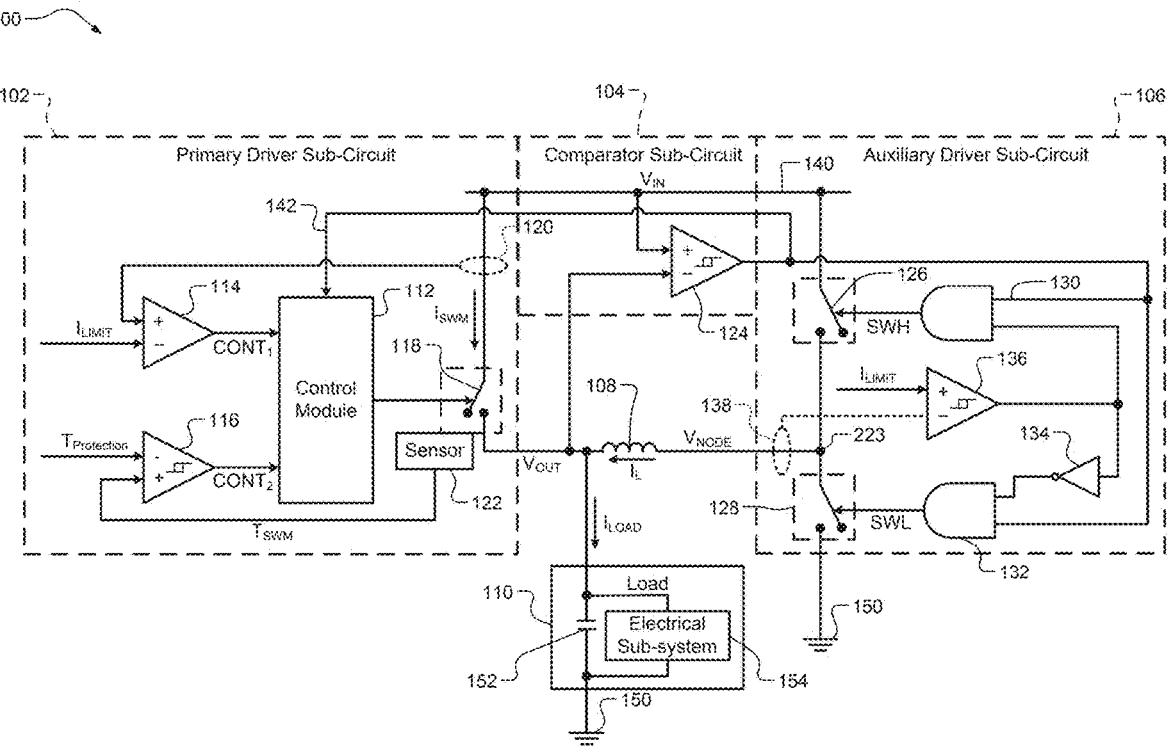
FIG. 4 is a block and schematic diagram of an example of a driver system in accordance with the present disclosure.

FIG. 4 shows a driver circuit 100 that includes a primary driver sub-circuit 102, a comparator sub-circuit 104, an auxiliary driver sub-circuit 106, an inductance 108 and a load 110. The primary driver sub-circuit 102 includes a control module 112, a first operational amplifier ("first amplifier") 114, a second operational amplifier ("second amplifier") 116, a first switch 118, a first current sensor 120 and a temperature sensor 122. The comparator sub-circuit 104 includes a third operation amplifier ("third amplifier") 124 that has a hysteresis voltage. As previously described, the comparator sub-circuit 104 detects when a high-power dissipation condition exists which could lead to overheating the primary driver sub-circuit. In one embodiment, this condition is detected by looking at the output signal of comparator 116 (which senses the temperature of the main switch 118).

The auxiliary driver sub-circuit 106 includes a high-side (or first) switch 126, a low-side (or second) switch 128, a first AND gate 130, a second AND gate 132, an inverter 134, a fourth operational amplifier ("fourth amplifier") 136, and a second current sensor 138. The fourth amplifier 136 has a hysteresis voltage. The amplifiers 114, 116, 124, 136 may be referred to as amplifier sub-circuits and may include comparators, hysteresis circuits and/or delay circuits, as further described below. The driver sub-circuits 102, 106 may include and/or be implemented as drivers.

A non-inverting input of the first amplifier 114 is connected to the first current sensor 120, which detects current supplied from a power supply input line 140 to the first switch 118. The non-inverting input receives a signal indicative of $I_{SWM}$. An inverting input of the first amplifier 114 receives $I_{LIMIT}$, which may be provided by a current reference sub-circuit (not shown). A non-inverting input of the second amplifier 116 receives an output of the temperature sensor 122, which detects a temperature of the first switch 118. An inverting input of the second amplifier 116 receives a temperature threshold $T_{PROTECTION}$, which may be accessed from a memory or a temperature sub-circuit (not shown). The amplifiers 114, 116 generate respectively a first control signal and a second control signal, which are provided to the control module 112. The control module 112 generates a state signal to control a state of the first switch 118 based on the first control signal, the second control signal, and an output of the third amplifier 124.

A non-inverting input of the third amplifier 124 is connected to the power supply input line 140. An inverting input of the third amplifier 124 is connected to an output terminal of the first switch 118, an output of the inductance 108 and to the load 110. An output of the third amplifier 124 is connected to (i) a first input of the first AND gate 130, (ii) a first input of the second AND gate 132, and (iii) an input of the control module 112. The third amplifier 124 compares a voltage of the power supply input line 140 to an output voltage of the first switch 118 and/or the primary driver sub-circuit 102 and generates a primary driver OFF signal (or auxiliary driver ON signal) 142. For example, when an output of the third amplifier 124 is HIGH or '1', the auxiliary driver sub-circuit 106 is activated and the control module 112 deactivates the primary driver sub-circuit by opening the first switch 118. Activation/deactivation of the primary driver sub-circuit 102 refers to the closing/opening of the first switch 118 and not deactivation of the control module 112, the amplifiers 114, 116, and the sensors 120, 122. Activation/deactivation of the auxiliary driver sub-circuit 106 refers to the closing/opening of the switches 126, 128, not the deactivation of the gates 130, 132, 134 and the fourth amplifier 136. If one of the switches 126, 128 is closed, then the auxiliary driver sub-circuit is activated. If both of the switches 126, 128 are open, then the auxiliary driver sub-circuit is deactivated.

The second switch 126 and the third switch 128 are connected in series between the power supply input line 140 and a ground reference 150. The first AND gate 130 generates a switch high-side signal (SWH) to control the state of the second switch 126. The second AND gate 132 generates a switch low-side signal (SWL) to control the state of the third switch 128. A second input of the first AND gate 130 is connected to an output of the fourth amplifier 136 and an input of the inverter 134. An output of the inverter 134 is connected to a second input of the second AND gate 132. A non-inverting input of the fourth amplifier 136 receives $I_{LIMIT}$. An inverting input of the fourth amplifier 136 is connected to and receives an output of the second current sensor 138. The inverting input of the fourth amplifier 136 receives a signal indicative of current $I_L$ through the inductance 108 from the second current sensor 138.

An input of the inductance 108 is connected to an output terminal of the second switch 126 and to an input terminal of the third switch 128. An output of the inductance 108 is connected to the output terminal of the first switch 118, to the inverting input of the third amplifier 124, and to the input of the load 110. The load 110 may include a capacitance 152 and/or electrical sub-system 154. The capacitance 152 may be connected in parallel with the electrical sub-system 154 and between (i) the first switch 118, the third amplifier 124, and the inductance 108 and (ii) the ground reference 150. The electrical sub-system 154 may include circuit components, such as one or more capacitances, resistances, inductances, amplifiers, converters, switches, processors, etc.

The example of FIG. 4 may be implemented in any switch sub-circuit, pass-gate sub-circuit or driver circuit that, at least in some circumstances, provides a predefined amount of current to a load. The example of FIG. 4 is especially advantageous for applications requiring high-power efficiency and/or low-heat dissipation. The example may be implemented in industrial switches, over-current-protected (OCP) switches and/or devices providing digital outputs.

The auxiliary driver sub-circuit 106 performs as a high-efficiency current source that is used to supplement current supplied by the primary driver sub-circuit 102 to the load 110. The primary driver sub-circuit 102 and the auxiliary driver sub-circuit 106 perform as a current source that switches between operating modes; (i) a first mode when the primary driver sub-circuit 102 is activated and the auxiliary driver sub-circuit 106 is deactivated, and (ii) a second mode when the primary driver sub-circuit 102 is deactivated and the auxiliary driver sub-circuit 106 is activated. The high-efficiency current source includes the two switches 126, 128 and the inductance 108. The auxiliary driver sub-circuit 106 operates in a switch-mode when activated by continuously switching between activating the high-side switch 126 and activating the low-side switch 128. The high-efficiency current source operates based on similar principles as a DC-to-DC switch-mode converter. Drops in the input to output voltage $V_{IN}$–$V_{OUT}$ of the primary driver sub-circuit 102 are primarily based on the inductance 108 instead of devices within the primary driver sub-circuit 102. This results in less power dissipated in the form of heat and improves overall power efficiency of the primary driver sub-circuit 102, which temporarily provides a controlled and limited current to the load 110. This power efficiency: i)

reduces the amount of heat generated by the primary driver sub-circuit 102, ii) reduces end product (a product that includes the driver circuit) size requirements (i.e. smaller package) due to smaller internal component size requirements as a result of less thermal energy being dissipated, and iii) reduces an amount of power consumption and/or power drawn from the power supply input line 140.

The auxiliary driver sub-circuit 106 is activated when a current-limit condition is detected (i.e. when the load 110 is drawing an amount of current that exceeds a preset threshold $I_{LIMIT}$). The auxiliary driver sub-circuit 106 may provide a fixed average current (equal to $I_{LIMIT}$) to the load 110. The primary driver sub-circuit 102 is switched OFF when the auxiliary driver sub-circuit 106 is switched ON and vice versa. When the current requested (or drawn) by the load 110 has decreased below $I_{LIMIT}$, the auxiliary driver sub-circuit 106 is turned OFF and the primary driver sub-circuit 102 is turned back ON.

The primary driver sub-circuit 102 may be a switch sub-circuit that sets $V_{OUT}$ equal to $V_{IN}$ less a small voltage drop on the first switch 118 due to a resistance of the first switch 118. The primary driver sub-circuit 102 limits an output current to a predefined level $I_{LIMIT}$. If the load 110 tends to draw a current higher than $I_{LIMIT}$, the primary driver sub-circuit 102 does not provide that current as an output and as a consequence the voltage $V_{OUT}$ across the load decreases. In other words, a current-limit condition is characterized by a high $V_{IN}$-$V_{OUT}$ voltage, whereas a normal operating condition is characterized by a low $V_{IN}$-$V_{OUT}$ voltage. The high $V_{IN}$-$V_{OUT}$ voltage is greater than the low $V_{IN}$-$V_{OUT}$ voltage.

The driver circuit 100 exploits advantages of the primary driver sub-circuit 102 and the auxiliary driver sub-circuit 106. When the load 110 requires a current lower than $I_{LIMIT}$, the primary driver sub-circuit 102 is active such that: a low switch ON-resistance may be achieved; the driver circuit 100 adapts to the load current demand with a maximum bandwidth; power dissipation is low since $V_{IN}$-$V_{OUT}$ is low by definition; and since little or no current is necessary to maintain the primary driver sub-circuit 102 in an ON state, the power efficiency is maximized. If a high $V_{IN}$-$V_{OUT}$ voltage condition exists, the auxiliary (or switching) driver sub-circuit 106 is activated and the primary driver sub-circuit 102 is deactivated to prevent the primary driver sub-circuit 102 from wasting a large amount of power in the form of heat. The auxiliary driver sub-circuit 106 is efficient in delivering power to the load 110 when a high $V_{IN}$-$V_{OUT}$ voltage condition exists. By switching between the driver sub-circuits 102, 106 as described, high-power efficiency can be obtained for the stated operating conditions.

As described above, the auxiliary driver sub-circuit 106 is triggered by a high $V_{IN}$-$V_{OUT}$ voltage. This condition is true not only during a current-limit condition but also each time the primary driver sub-circuit 102 is turned ON. When the primary driver sub-circuit 102 is turned ON, $V_{OUT}$ is usually equal to a ground potential. The primary driver sub-circuit 102 then pulls (or attempts to pull) $V_{OUT}$ up to a potential of $V_{IN}$. In order not to interfere with the normal operation of the primary driver sub-circuit 102 (i.e. when the load 110 does not cause the driver circuit 100 to transition to current-limit state), activation of the auxiliary driver sub-circuit 106 is delayed. The activation may be delayed by a time $T_{DELAY}$ that is longer than a maximum expected rise time of $V_{OUT}$ to $V_{IN}$.

Figure 5:
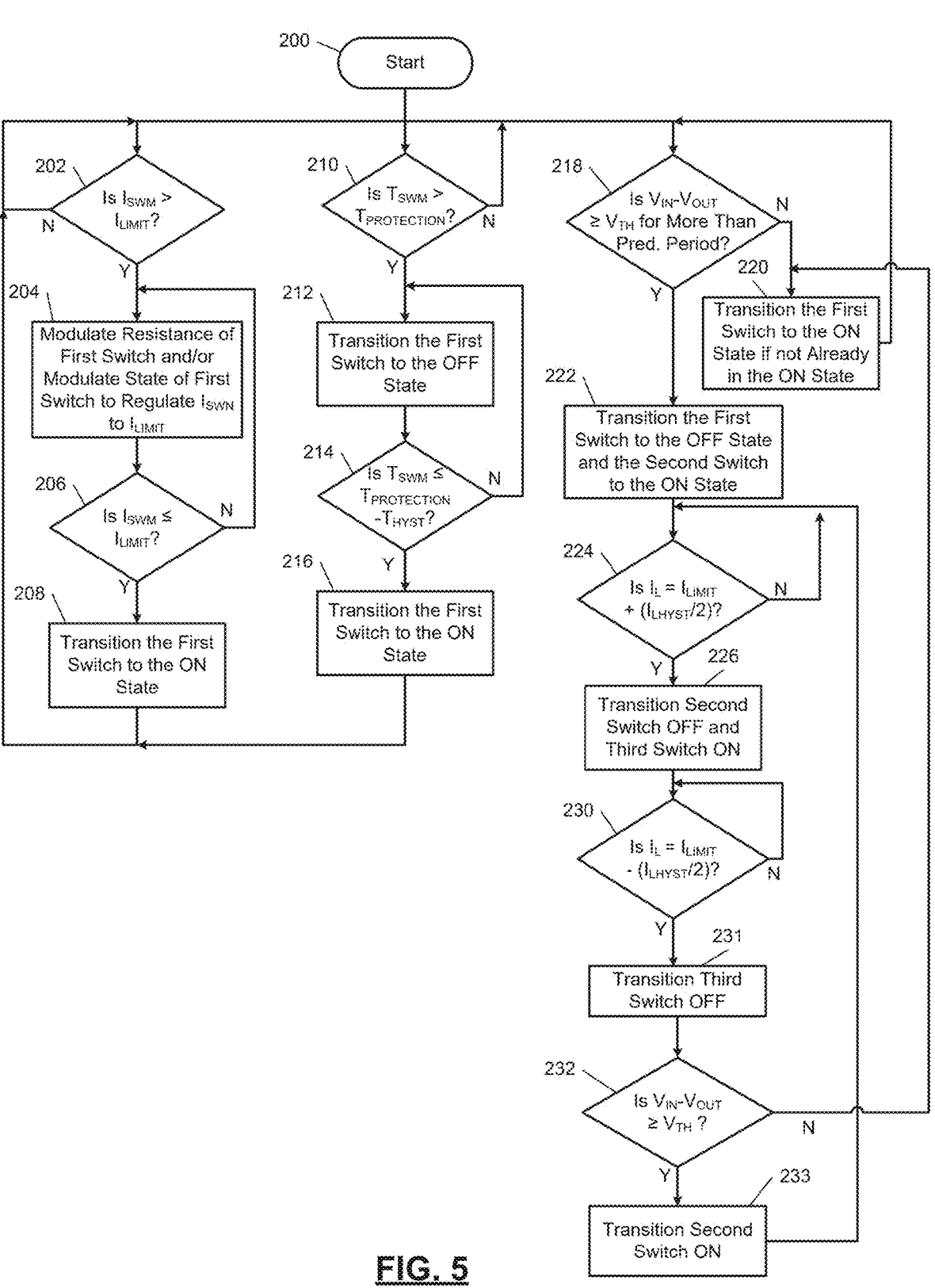
FIG. 5 illustrates an example of a driver method in accordance with the present disclosure.

The driver circuit 100 may be implemented in switch sub-circuits, pass-gate sub-circuits, industrial switches, OCP switch sub-circuits, etc. A switch sub-circuit is a sub-circuit that includes one or more switches, which are used to provide a predetermined amount of current to a load. For further defined structure of the sub-circuits of FIG. 4 see below provided method of FIG. 5 and below provided definition for the term "sub-circuit". The driver circuits disclosed herein may be operated according to the method of FIG. 5. Although the following tasks are primarily described with respect to the implementations of FIG. 4, the tasks may be easily modified to apply to other implementations of the present disclosure. The tasks may be iteratively performed.

The following tasks 202-208 may be performed in parallel with and/or while tasks 210-216 and tasks 218-232 are performed. Similarly tasks 210-216 may be performed in parallel with and/or while tasks 218-232 are performed. Each set of tasks (i.e. tasks 202-208, 210-216, and 218-232) may be iteratively performed. In one embodiment, tasks 204-208 and 212-216 are primarily performed if not completely performed when the result of task 218 is FALSE (i.e. $V_{IN}$-$V_{OUT}$ is less than $V_{TH}$ for a predetermined period referred to for task 218). If the result of task 218 is FALSE, the primary driver sub-circuit 102 is activated and the auxiliary driver sub-circuit 106 is deactivated. If the result of task 218 is TRUE, then the auxiliary driver sub-circuit 106 is activated and the primary driver sub-circuit 102 is deactivated.

The method may begin at 200. At 202, the first amplifier 114 compares the current $I_{SWM}$ detected by the first current sensor 120 to the current $I_{LIMIT}$ and generates a current limit (or first control) signal. If $I_{SWM}$>$I_{LIMIT}$, then task 204 is performed.

At 204, if $I_{SWM}$>$I_{LIMIT}$, then the control module 112 modulates and/or transitions the first switch 118 between open and closed states to regulate the current $I_{SWM}$ to $I_{LIMIT}$.

At 206, the control module 112 determines whether $I_{SWM}$ is less than or equal to $I_{LIMIT}$ based on the output of the first amplifier 114. If $I_{SWM}$>$I_{LIMIT}$, then task 208 is performed. At 208, if $I_{SWM}$>$I_{LIMIT}$, then the control module 112 ceases to modulate the state of the first switch 118 and/or maintains the switch in a closed state. Task 202 may be performed subsequent to task 208.

At 210, the second amplifier 116 compares a temperature threshold $T_{PROTECTION}$ to a temperature $T_{SWM}$ of the first switch 118 as detected by the temperature sensor 122. The second amplifier 116 generates a thermal shutdown (or second control signal) based on the comparison between $T_{PROTECTION}$ and $T_{SWM}$. If $T_{SWM}$>$T_{PROTECTION}$, then task 212 is performed.

At 212, if $T_{SWM}$>$T_{PROTECTION}$, then the control module 112 transitions the first switch 118 to an open state and the current $I_{SWM}$ decreases to 0.

At 214, the control module 112 determines whether $T_{SWM}$≤$T_{PROTECTION}$-$T_{HYST}$ based on the output of the second amplifier 116, where $T_{HYST}$ is a hysteresis temperature. The second amplifier 116 has a temperature hysteresis circuit to determine if $T_{SWM}$≤$T_{PROTECTION}$-$T_{HYST}$. If $T_{SWM}$≤$T_{PROTECTION}$-$T_{HYST}$, then task 216 is performed.

At 216, the first switch 118 is turned back ON (or closed) when $T_{SWM}$ decreases below $T_{PROTECTION}$-$T_{HYST}$. Task 210 may be performed subsequent to task 216.

At 218, the third amplifier 124 compares $V_{OUT}$ to $V_{IN}$ and generates an output signal indicating whether $V_{IN}$-$V_{OUT}$≥$V_{TH}$ for at least a predetermined period $T_{DELAY}$. This an example of detecting when a condition exists for a maximum amount of current to be supplied to the load. The third amplifier 124 may have a delay circuit to determine whether $V_{IN}$-$V_{OUT}$≥$V_{TH}$ for at least a predetermined period $T_{DELAY}$. $T_{DELAY}$ is set to be long enough to allow the low-to-high transition of $V_{OUT}$ in normal operating conditions (i.e. when no current-limit condition exists) without triggering the auxiliary driver sub-circuit 106 during the normal operating conditions. If a condition exists for a maximum amount of current to be supplied to the load and/or $V_{IN}-V_{OUT} \geq V_{TH}$, then task 222 is performed, otherwise task 220 is performed. At 220, the first switch 118 is transitioned to the ON state if not already in the ON state.

At 222, the first switch 118 is transitioned to the OFF state and the second switch 126 is transitioned to the ON state. The primary driver sub-circuit 102 is switched OFF and the auxiliary driver sub-circuit 106 is switched ON by the output of the third amplifier 124. When the auxiliary driver sub-circuit 106 is activated by the third amplifier 124 (i.e. when $V_{OUT}$ is less than $V_{IN}$ by at least $V_{TH}$) the current through the inductance 108 is zero and as a result the fourth amplifier 136 transitions the second switch 126 to a closed state. A voltage at a node 223, between the switches 126, 128 and connected to the input of the inductance 108, is pulled up to the voltage of the power supply input line 140 and a difference in voltage $V_{NODE}-V_{OUT}$ across the inductance 108 causes the current $I_L$ through the inductance 108 to increase, where $V_{NODE}$ is the voltage at the node 223.

At 224, the fourth amplifier 136 compares the current through the inductance $I_L$ to $I_{LIMIT}$ and generates an output signal indicative of whether $I_L=I_{LIMIT}+I_{LHYST}/2$, where $I_{LHYST}$ is a hysteresis current. Task 226 is performed when the current $I_L$ reaches $I_{LIMIT}+IL_{hyst}/2$.

At 226, the fourth amplifier 136 changes state and causes the second (or high-side) switch 126 to transition to the OFF state and the third (or low-side) switch 128 to transition to the ON state. This causes the voltage at the node 223 to be pulled to the ground potential or a reference potential. The voltage across the inductance 108 changes sign and becomes $-V_{OUT}$, thus causing the current $I_L$ to decrease. Once the current $I_L$ has fallen to $I_{LIMIT}-IL_{hyst}/2$, as determined by the fourth amplifier 136 at 230, the output of the fourth amplifier 136 changes state. Task 231 is performed when $I_L$ decreases to be equal to $I_{LIMIT}-IL_{hyst}/2$ resulting in the third switch turning off. Decision 232 determines when $V_{IN}-V_{OUT}$ is greater than $V_{TH}$, then the second switch transitions to on. If $V_{IN}-V_{OUT}$ is less than $V_{TH}$, then we return to task 220. Tasks 224-233 may be performed indefinitely. The net effect of tasks 224-233 is that an average current through the inductance 108 is $I_{LIMIT}$.

The above-described tasks are meant to be illustrative examples; the tasks may be performed sequentially, synchronously, simultaneously, continuously, during overlapping time periods or in a different order depending upon the application. Also, any of the tasks may not be performed or skipped depending on the implementation and/or sequence of events.

The power dissipated inside the auxiliary driver sub-circuit 106 is $Ron_{SWH}*I_{LIMIT}^2$ when the second switch 126 is ON and is $Ron_{SWL}*I_{LIMIT}^2$ when the third switch 128 is ON, where $Ron_{SWH}$ is the on-resistance of the second switch 126 and $Ron_{SWL}$ is the on-resistance of the third switch 128. The switches 126, 128 may be sized large enough to have minimized on-resistances with minimized associated power dissipation values to prevent a temperature of the auxiliary driver sub-circuit 106 from ever reaching a thermal protection level. In other words, the auxiliary driver sub-circuit 106 may be designed to deliver current indefinitely, independent of the load connected to the auxiliary driver sub-circuit 106.

The auxiliary driver sub-circuit 106 is kept active while $V_{OUT}$ is less than $V_{IN}$ by at least $V_{TH}$. When $V_{OUT}-V_{IN}$ is less than or equal to $V_{TH}$, the primary driver sub-circuit 102 may be reactivated. As a result, the primary driver sub-circuit 102 dissipates a maximum power of $V_{TH}*I_{LIMIT}$, where $V_{TH}$ may be, for example 2 V. This is unlike a traditional driver sub-circuit (e.g., the driver sub-circuit 10 of FIG. 1), which may dissipate a maximum power of $V_{IN}*I_{LIMIT}$. Since $V_{IN}$ can be tens of volts, the power dissipation is reduced considerably.

Figure 6:
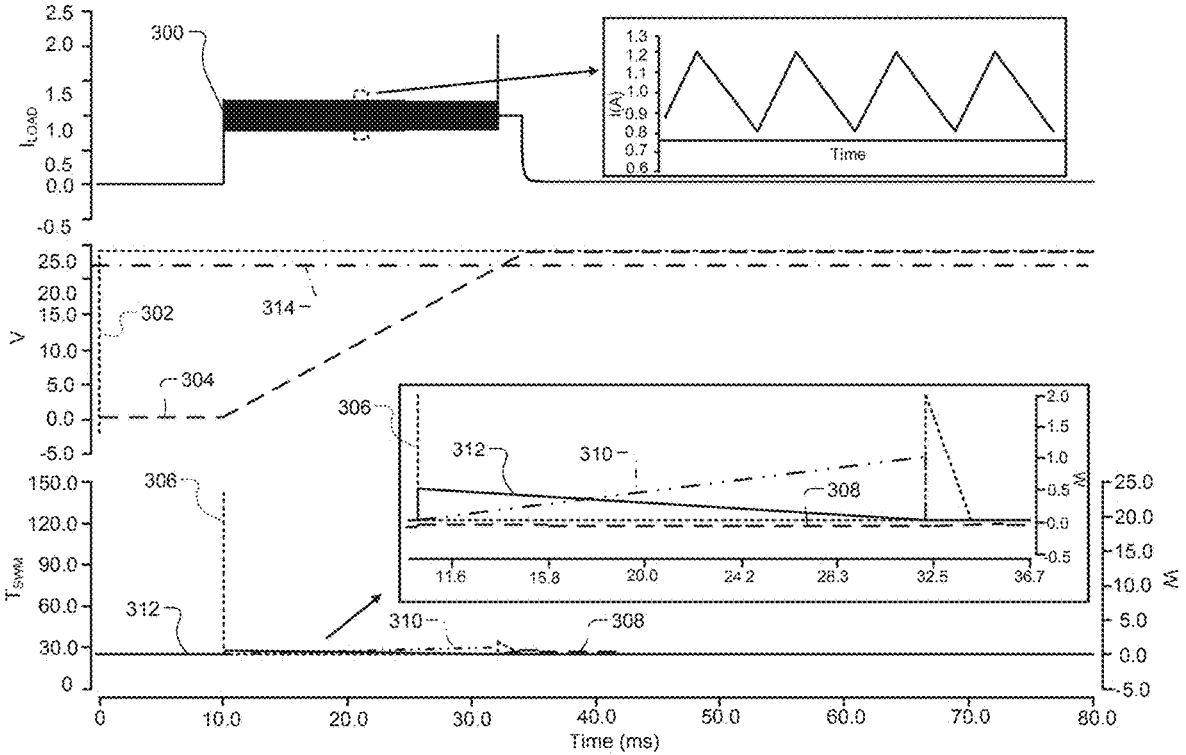
FIG. 6 is a signal diagram for the driver sub-circuit of FIG. 4 and a large capacitance load in accordance with the present disclosure.
Figure 7:
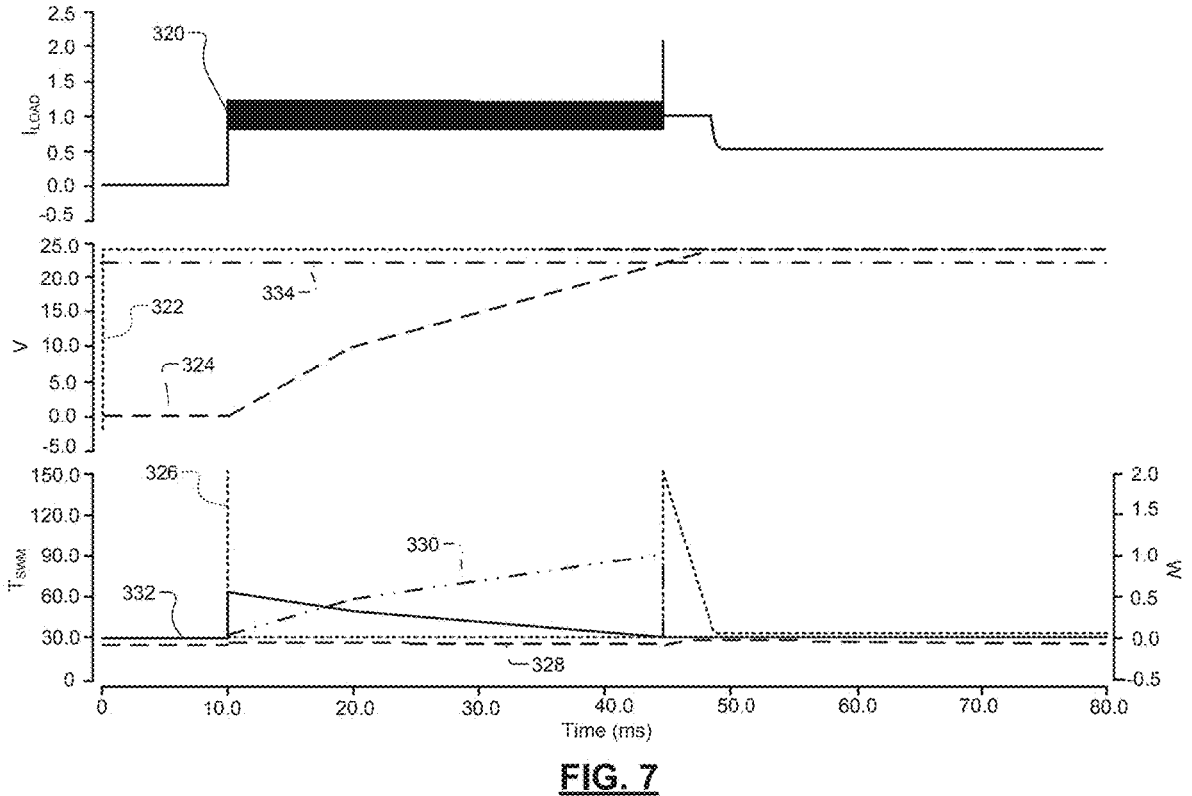
FIG. 7 is a signal diagram for the driver sub-circuit of FIG. 4 and a load that includes a capacitance and additional circuit components in accordance with the present disclosure.

As a couple of examples, FIGS. 6-7 show behavior of the driver circuit 100 of FIG. 4 for similar circumstances (i.e. some of the same parameters) described above with respect to the examples of FIGS. 2-3. The physical parameters used for the examples of FIGS. 6-7 include $V_{IN}=24V$, $I_{LIMIT}=1$ A, $C_{load}=1$ mF, junction to ambient thermal resistance of the first switch 118=20 C/W, a thermal capacitance of the first switch 118=1 mJ/C, $Ron_{SWH}=1\Omega$, $Ron_{SWL}=122$, an inductance L of the inductance 108=20 µH, $V_{TH}=2V$, $I_{Lhyst}=400$ mA, and $T_{DELAY}=100$ micro-seconds (µs).

FIG. 6 shows a signal diagram for the driver circuit 100 of FIG. 4 illustrating load current $I_{LOAD}$ (signal line 300), input and output voltages $V_{IN}$, $V_{OUT}$ (signal lines 302, 304), switch power $P_{SWM}$ (signal line 306) of the primary driver sub-circuit 102, temperature $T_{SWM}$ of the first switch 118 (signal line 308), and power levels at switches 126, 132 (signal lines 310, 312). An auxiliary driver sub-circuit threshold voltage is shown by line 314.

In FIG. 6 the load 110 includes the capacitance 152 and not the electrical sub-system 154. The capacitance 152 may be for example a 1 mF capacitor. The primary driver sub-circuit 102 starts delivering the limited current $I_{LIMIT}$, but when $V_{OUT}$ is less than $V_{IN}$, the primary driver sub-circuit 102 switches control to the auxiliary driver sub-circuit 106. Since the primary driver sub-circuit 102 is primarily in a deactivated (or OFF) state, the temperature of the primary driver sub-circuit 102 never reaches a thermal protection threshold and the current supplied to the load 110 is not interrupted. Power dissipated inside each of the switches 118, 126, 128 is less than 1 W. This is unlike the power dissipated by the driver sub-circuit 10 of FIG. 1, which is up to 24 W for the same corresponding example application.

FIG. 7 shows a signal diagram for the driver circuit 100 of FIG. 4 illustrating load current $I_{LOAD}$ (signal line 320), input and output voltages $V_{IN}$, $V_{OUT}$ (signal lines 322, 324), switch power $P_{SWM}$ (signal line 326) of the primary driver sub-circuit 102, temperature $T_{SWM}$ of the first switch 118 (signal line 328), and power levels at switches 126, 132 (signal lines 330, 332). An auxiliary driver sub-circuit threshold voltage is shown by line 334.

In FIG. 7 the load 110 includes the capacitance 152 and the electrical sub-system 154. The capacitance may be 1 mF or other capacitance. The electrical sub-system 154 starts sinking a current $I_{LIMIT}/2$ when $V_{OUT}$ reaches 10V. Since the auxiliary driver sub-circuit 106 does not transition to a thermal protection mode, the current through the first switch 118 is uninterrupted and the primary driver sub-circuit 102 is able to charge the capacitance 152 to a final voltage of $V_{IN}$. This allows the electrical sub-system to be activated correctly and operate at a steady-state voltage equal to and/or based on $V_{IN}$.

The above-described implementations reduce the amount of heat generated inside a driver circuit and/or driver sub-circuits. Less power is dissipated inside the chips (e.g., a primary driver sub-circuit, a comparator module and an auxiliary driver sub-circuit) of the driver circuit. As a result, a temperature of a switch of a corresponding primary driver sub-circuit remains the same as or within a minimal predetermined range an ambient temperature. The overall physical volume of an end product may be reduced (i.e. have a smaller package) due to the driver circuit generating less heat. Reducing package size can increase thermal impedance of the package (i.e. increase thermal resistance and/or decrease thermal capacitance). Reduced heat dissipation, reduces power consumption. When an auxiliary driver sub-circuit of the disclosed driver circuit is active, the auxiliary driver sub-circuit absorbs current from a power supply when a high-side switch is ON and not when a low-side switch is ON. With a pure capacitive load (the load includes only a capacitance), up to 50% of the power typically consumed by a traditional driver can be conserved by the disclosed driver circuit.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between sub-circuits, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In this application, including the definitions below, the term "sub-circuit" or the term "controller" may be replaced with the term "circuit." The term "sub-circuit" may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor circuit (shared, dedicated, or group) that executes code; a memory circuit (shared, dedicated, or group) that stores code executed by the processor circuit; other suitable hardware components that provide the described functionality; or a combination of some or all of the above, such as in a system-on-chip.

The sub-circuit may include one or more interface circuits. In some examples, the interface circuits may include wired or wireless interfaces that are connected to a local area network (LAN), the Internet, a wide area network (WAN), or combinations thereof. The functionality of any given sub-circuit of the present disclosure may be distributed among multiple sub-circuits that are connected via interface circuits. For example, multiple sub-circuits may allow load balancing. In a further example, a server (also known as remote, or cloud) sub-circuit may accomplish some functionality on behalf of a client sub-circuit.

The term code, as used above, may include software, firmware, and/or microcode, and may refer to programs, routines, functions, classes, data structures, and/or objects. The term shared processor circuit encompasses a single processor circuit that executes some or all code from multiple sub-circuits. The term group processor circuit encompasses a processor circuit that, in combination with additional processor circuits, executes some or all code from one or more sub-circuits. References to multiple processor circuits encompass multiple processor circuits on discrete dies, multiple processor circuits on a single die, multiple cores of a single processor circuit, multiple threads of a single processor circuit, or a combination of the above. The term shared memory circuit encompasses a single memory circuit that stores some or all code from multiple sub-circuits. The term group memory circuit encompasses a memory circuit that, in combination with additional memories, stores some or all code from one or more sub-circuits.

The term memory circuit is a subset of the term computer-readable medium. The term computer-readable medium, as used herein, does not encompass transitory electrical or electromagnetic signals propagating through a medium (such as on a carrier wave); the term computer-readable medium may therefore be considered tangible and non-transitory. Non-limiting examples of a non-transitory, tangible computer-readable medium are nonvolatile memory circuits (such as a flash memory circuit, an erasable programmable read-only memory circuit, or a mask read-only memory circuit), volatile memory circuits (such as a static random access memory circuit or a dynamic random access memory circuit), magnetic storage media (such as an analog or digital magnetic tape or a hard disk drive), and optical storage media (such as a CD, a DVD, or a Blu-ray Disc).

The apparatuses and methods described in this application may be partially or fully implemented by a special purpose computer created by configuring a general purpose computer to execute one or more particular functions embodied in computer programs. The functional blocks, flowchart components, and other elements described above serve as software specifications, which can be translated into the computer programs by the routine work of a skilled technician or programmer.

The computer programs include processor-executable instructions that are stored on at least one non-transitory, tangible computer-readable medium. The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc.

The computer programs may include: (i) descriptive text to be parsed, such as HTML (hypertext markup language) or XML (extensible markup language), (ii) assembly code, (iii) object code generated from source code by a compiler, (iv) source code for execution by an interpreter, (v) source code for compilation and execution by a just-in-time compiler, etc. As examples only, source code may be written using syntax from languages including C, C++, C#, Objective C, Haskell, Go, SQL, R, Lisp, Java®, Fortran, Perl, Pascal, Curl, OCaml, Javascript®, HTML5, Ada, ASP (active server pages), PHP, Scala, Eiffel, Smalltalk, Erlang, Ruby, Flash®, Visual Basic®, Lua, and Python®.

None of the elements recited in the claims are intended to be a means-plus-function element within the meaning of 35 U.S.C. § 112 (f) unless an element is expressly recited using the phrase "means for," or in the case of a method claim using the phrases "operation for" or "step for."

What is claimed is:

1. A driver circuit comprising:
a primary driver sub-circuit configured to (i) generate an output voltage, and (ii) supply a predetermined maximum amount of current from a power source to a load via a first switch, wherein the first switch is coupled between the power source and the load, and wherein the power source supplies a source voltage;
a comparator sub-circuit configured to (i) detect when a high-power dissipation condition exists, and (ii) based on detection of the condition, generate a first output signal, wherein the primary driver sub-circuit is configured to control a state of the first switch based on the first output signal; and
an auxiliary driver sub-circuit configured to, based on the first output signal, transition between (i) pulling-up the output voltage to the source voltage and supplying current from the power source to the load, and (ii) decreasing an amount of current being supplied to the load.

2. The driver circuit of claim 1, further comprising an inductance connected between (i) the first switch, the comparator sub-circuit, and the load and (ii) the auxiliary driver sub-circuit.

3. The driver circuit of claim 1, wherein the primary driver sub-circuit comprises:
a first amplifier configured to generate a first control signal based on a comparison between a level of current through the first switch and a limited current level;
a second amplifier configured to generate a second control signal based on a comparison between a temperature of the switch and a temperature threshold; and
a control module configured to control a state of the first switch based on the first control signal and the second control signal.

4. The driver circuit of claim 3, wherein the primary driver sub-circuit comprises:
a current sensor configured to detect the level of current through the first switch and generate a current signal indicative of the level of current through the first switch; and
a temperature sensor configured to detect the temperature of the first switch and generate a temperature signal indicative of the temperature of the first switch.

5. The driver circuit of claim 1, wherein:
the comparator sub-circuit is configured to, in detecting the condition, (i) compare the source voltage of the power source to an output voltage of the primary driver sub-circuit, and (ii) generate a first output signal based on the comparison between the source voltage and the output voltage;
the comparator sub-circuit comprises an amplifier; and the amplifier is configured to (i) receive the source voltage of the power source and the output voltage of the primary driver sub-circuit, and (ii) generate the first output signal.

6. The driver circuit of claim 1, wherein the auxiliary driver sub-circuit comprises:
a second switch configured to (i) receive current from the power source, (ii) change state based on the first output signal, and (iii) provide the current from the power source to the load; and
a third switch connected in series with the second switch, wherein the third switch is configured to (i) change state based on the first output signal, and (ii) decrease the amount of current being supplied to the load by indirectly connecting an input of the load to a ground reference.

7. The driver circuit of claim 6, wherein:
the auxiliary driver sub-circuit comprises an amplifier; and
the amplifier is configured to generate a second output signal based on a comparison between (i) a limited level of current and (ii) an amount of current flowing out of the auxiliary driver sub-circuit to the load,
the state of the second switch and the state of the third switch are based on the second output signal.

8. The driver circuit of claim 7, wherein:
the auxiliary driver sub-circuit comprises a current sensor;
the current sensor is configured to detect the amount of current flowing out of the auxiliary driver sub-circuit to the load; and
the amount of current flowing out of the auxiliary driver sub-circuit to the load passes through an inductor prior to being received at the load.

9. The driver circuit of claim 7, wherein the auxiliary driver sub-circuit comprises:
a first AND gate configured to control the state of the second switch based on the first output signal and the second output signal; and
a second AND gate configured to control the state of the third switch based on the first output signal and an inverted state of the second output signal.

10. The driver circuit of claim 6, further comprising an inductance connected between (i) the first switch, the comparator sub-circuit, and the load and (ii) the auxiliary driver sub-circuit, wherein the auxiliary driver sub-circuit is configured to:
transition the second switch to a closed state if a difference between the source voltage and the output voltage is greater than or equal to a voltage threshold for a predetermined period of time;
transition the second switch to an open state and the third switch to a closed state if an amount of current through the second switch is equal to a sum of a limited level of current and half of a hysteresis current; and
transition the second switch to a closed state and the third switch to an open state if the amount of current through the inductance is equal to the limited level of current minus the half of the hysteresis current.

* * * * *